(12) United States Patent
Semba

(10) Patent No.: US 6,338,474 B1
(45) Date of Patent: Jan. 15, 2002

(54) AIR FEEDER PROVIDED WITH BY-PASS BYPASSING COOLING SECTION, SUBSTRATE PROCESSING APPARATUS INCLUDING THE SAME, AND AIR SUPPLY METHOD

(75) Inventor: Norio Semba, Kumamoto-Ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/500,786

(22) Filed: Feb. 9, 2000

(30) Foreign Application Priority Data

Feb. 9, 1999 (JP) ............................. 11-031528

(51) Int. Cl.⁷ ................................. B01F 3/04
(52) U.S. Cl. ................ 261/128; 261/130; 261/131; 261/137; 261/138; 165/65; 165/103; 165/227; 165/228; 165/298
(58) Field of Search ................ 261/46, 55, 63, 261/127, 128, 129, 130, 131, 133, 137, 138, 140.1, 140.2, DIG. 15; 165/65, 103, 227, 228, 298

(56) References Cited

U.S. PATENT DOCUMENTS

| | | | | |
|---|---|---|---|---|
| 903,150 A | * | 11/1908 | Braemer | 261/129 |
| 1,966,275 A | * | 7/1934 | Wright | 261/130 |
| 2,307,292 A | * | 1/1943 | Palmer | 261/130 |
| 2,694,042 A | * | 11/1954 | Tapleshay et al. | 261/128 |
| 3,618,659 A | * | 11/1971 | Rawal | 165/107 |
| 4,494,596 A | * | 1/1985 | Bradshaw | 261/137 |
| 4,750,545 A | * | 6/1988 | Hile et al. | 236/44 B |

FOREIGN PATENT DOCUMENTS

JP          A1 2-1113         1/1990

* cited by examiner

Primary Examiner—C. Scott Bushey
(74) Attorney, Agent, or Firm—Rader, Fishman & Grauer, PLLC

(57) ABSTRACT

In an air feeder for supplying air with a predetermined temperature and humidity into a cup in a resist coating unit provided in a coating and developing system, a cooling section, a by-pass, a heating section, a humidifying section, and a blower are provided. 55% of introduced air is cooled in the cooling section, 45% of the introduced air passes through the by-pass, and mixed air of the cooled air and the air from the by-pass is heated in the heating section and humidified in the humidifying section, thereby enabling energy-saving and space-saving temperature and humidity control.

15 Claims, 12 Drawing Sheets

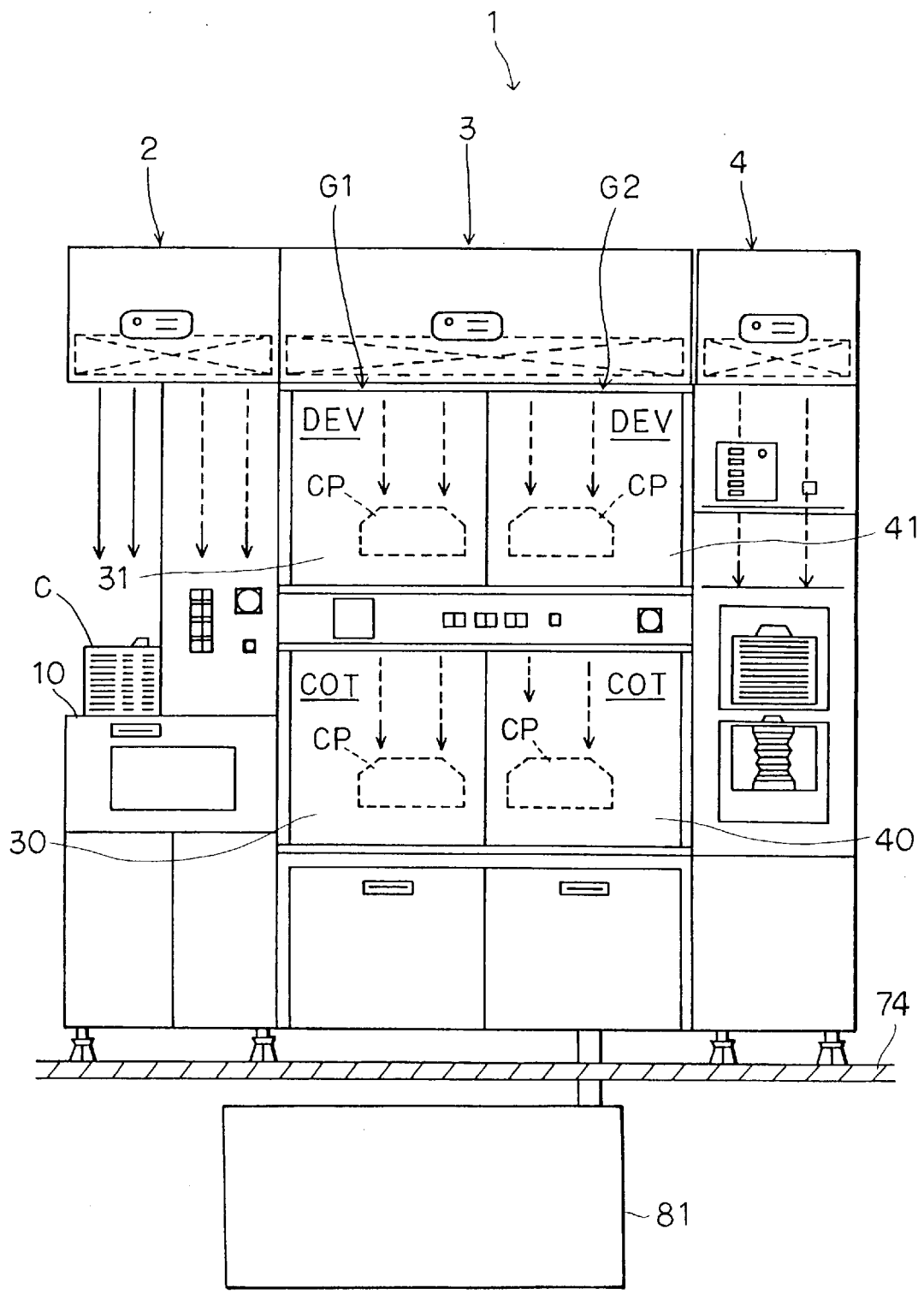
F I G. 2

AIR FEEDER PROVIDED WITH BY-PASS BYPASSING COOLING SECTION, SUBSTRATE PROCESSING APPARATUS INCLUDING THE SAME, AND AIR SUPPLY METHOD

BACKGROUND OF THE INVENTION

1. Field of the Invention

The present invention relates to an air feeder used for a substrate processing apparatus for coating a substrate, for example, a semiconductor wafer, a glass substrate for a liquid crystal display device, or the like with a resist and developing the substrate, a substrate processing apparatus including the air feeder, and an air supply method.

2. Description of the Related Art

In the photolithography of a semiconductor wafer (hereinafter referred to as "a wafer"), a wafer is coated with a resist, and subsequently a pattern is exposed and then developed. A coating and developing system in which processing units each for performing processing individually are integrated is conventionally used for such a series of processings.

In the above coating and developing system, as to resist coating processing, for example, a wafer is spun within a processing container to thereby diffuse a resist on the wafer by centrifugal force, and thus a resist film with a predetermined thickness is formed on the wafer. The thickness of the resist film is very sensitive to temperature and humidity, and hence air set at a predetermined temperature and humidity is supplied into the processing container.

The air is supplied from an attached air feeder. The air feeder introduces an atmosphere inside a clean room, for example, and includes a cooling section for cooling the introduced air, a heating section for heating the air, a humidifying section for humidifying the air, and a blower for supplying the air into the processing container for performing the resist coating processing. The air is once cooled to the vicinity of a dew-point temperature, for example, 5° C. by a refrigerator in the cooling section, thereafter heated by heating to attain a predetermined temperature and relative humidity, and finally moisture necessary for the predetermined relative humidity is given by the humidifying section.

In the air feeder configured as above, however, the introduced air is introduced in full to the cooling section, and all of the air is once cooled to the vicinity of a dew-point temperature and dehumidified, and thereafter heated and humidified. Hence, consumed energy in the cooling section, the heating section, and the humidifying section is large. Moreover, the air feeder is increased in size, thus causing a waste of installation space.

SUMMARY OF THE INVENTION

An object of the present invention is to provide a new substrate processing apparatus, air feeder, and air supply method capable of energy-saving and space-saving temperature and humidity control.

To attain the above object, a first aspect of the present invention is a substrate processing apparatus comprising a processing container for processing a substrate and an air feeder for controlling temperature and humidity of air introduced from an air inlet and supplying the air to the processing container, in which the air feeder comprises a cooling section for cooling the air introduced from the air inlet, a by-pass for allowing the air introduced from the air inlet to bypass the cooling section, a mixing section for mixing the air cooled by the cooling section and the air bypassed by the by-pass, a heating section for heating the air mixed by the mixing section, and a humidifying section for humidifying the air heated by the heating section.

A second aspect of the present invention is a substrate processing apparatus comprising a processing container for processing a substrate and an air feeder for controlling temperature and humidity of air introduced from an air inlet for introducing part of air exhausted from the processing container and air outside the substrate processing apparatus and supplying the air to the processing container, in which the air feeder comprises a cooling section for cooling the air introduced from the air inlet, a by-pass for allowing the air introduced from the air inlet to bypass the cooling section, a blower for blowing the air introduced from the air inlet into the cooling section and the by-pass, a mixing section for mixing the air cooled by the cooling section and the air bypassed by the by-pass, a heating section for heating the air mixed by the mixing section, and a humidifying section for humidifying the air heated by the heating section.

A third aspect of the present invention is an air feeder for controlling temperature and humidity of air introduced from an air inlet and supplying the air to a processing container for processing a substrate, comprising a cooling section for cooling the air introduced from the air inlet, a by-pass for allowing the air introduced from the air inlet to bypass the cooling section, a mixing section for mixing the air cooled by the cooling section and the air bypassed by the by-pass, a heating section for heating the air mixed by the mixing section, and a humidifying section for humidifying the air heated by the heating section.

A fourth aspect of the present invention is an air supply method for controlling temperature and humidity of air and supplying the air to a processing container for processing a substrate, comprising the steps of dividing the air to be supplied between a first passage and a second passage, cooling the air divided for the first passage, mixing the air divided for the first passage and cooled therein and the air divide for the second passage, heating the mixed air, and humidifying the heated air.

In the present invention, for example, 55% of air introduced from the air inlet of the air feeder is cooled by passing through the cooling section. Meanwhile, the remaining 45% of the air is bypassed without passing through the cooling section and maintained in the state in which it was introduced from an inlet side. In this case, nearly half of the air only is cooled in the cooling section, thus reducing consumed electric power during cooling as compared with the case where all of the introduced air is cooled. After the cooled air and the air from the by-pass are mixed, the mixed air is heated in the heating section, and finally humidified in the humidifying section. In this case, the temperature and relative humidity of the mixed air are higher in comparison with the case all of the introduced air is cooled, whereby consumed electric power during heating and humidification can be also reduced. As a result, energy-saving temperature and humidity control becomes possible. Further, designs and the like of the cooling section, the heating section, and the humidifying section can be one size smaller than in the prior art owing to the energy saving. Consequently, it becomes possible to downsize the feeder.

These objects and still other objects and advantages of the present invention will become apparent upon reading the following specification when taken in conjunction with the accompanying drawings.

BRIEF DESCRIPTION OF THE DRAWINGS

FIG. 2 is a front view of the coating and developing system in FIG. 1;

DETAILED DESCRIPTION OF THE PREFERRED EMBODIMENTS

Figure 1:
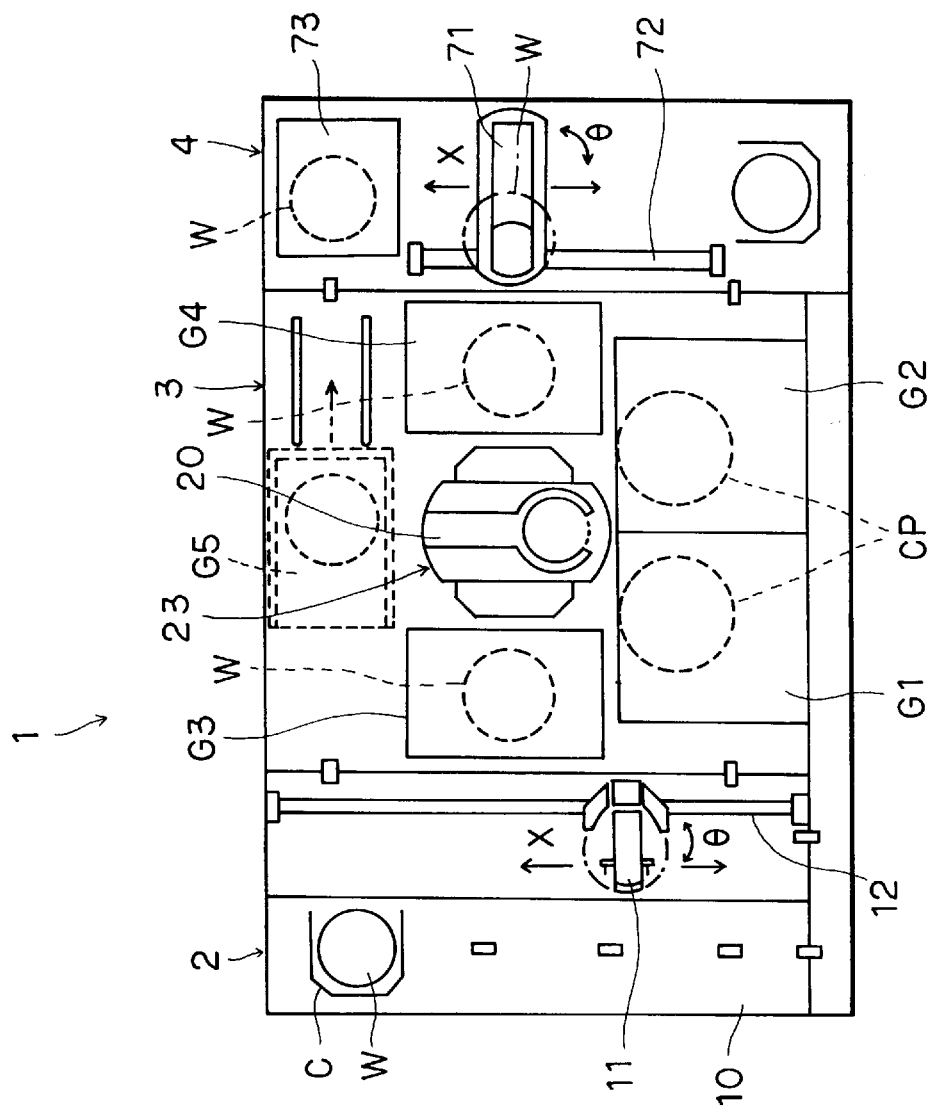
FIG. 1 is a plane view of a coating and developing system according to an embodiment of the present invention.

As shown in FIG. 1, a coating and developing system 1 has a configuration in which a cassette station 2 for transferring a cassette C housing 25 wafers W, for example, from/to the outside into/from the coating and developing system 1 and carrying the wafer W into/out of the cassette C, a processing station 3 in which various kinds of processing units each for performing predetermined processing for the wafers W one by one are disposed, and an interface section 4 for receiving and sending the wafer W from/to the processing station 3 and an aligner (not illustrated) are integrally connected.

In the cassette station 2, a plurality of cassettes C can be freely mounted with respective transfer ports for the wafer W facing the side of the processing station 3 at predetermined positions on a cassette mounting table 10 in a line in an X-direction (a vertical direction in FIG. 1). A wafer transfer body 11 movable in the direction of arrangement of the cassettes (the X-direction) and in the direction of arrangement of the wafers W housed in the cassette C (a Z-direction; a vertical direction) is movable along a transfer path 12 and selectively accessible to each of the cassettes C.

The wafer transfer body 11 is also structured to be rotatable in a θ-direction so that it can get access to and transfer the wafer W from/to an alignment unit 52 and an extension unit 53 included in multi-tiered units in a third processing unit group $G_3$ on the processing station 3 side which will be described later.

In the processing station 3, a main transfer device 23 provided with three pairs of tweezers 20, 21, and 22 for holding the wafer W respectively at the upper, middle, and lower tiers is disposed in the center thereof. Around the main transfer device 23, various kinds of processing units are multi-tiered to compose processing unit groups. In the coating and developing system 1 according to the present embodiment, five processing unit groups $G_1$, $G_2$, $G_3$, $G_4$, and $G_5$ can be arranged. The first and second processing unit groups $G_1$ and $G_2$ are arranged on the front side of the coating and developing system 1, the third processing unit group $G_3$ is arranged on the cassette station 2 side, and the fourth processing unit group $G_4$ is arranged on the interface section 4 side. Moreover, the fifth processing unit group $G_5$ shown by a broken line can be arranged on the rear side of the coating and developing system 1.

As shown in FIG. 2, in the first processing unit group $G_1$, two spinner-type processing units in each of which the wafer W is mounted on a spin chuck to undergo predetermined processing within a cup CP, for example, a resist coating unit 30 and a developing unit 31 are two-tiered from the bottom in order. In the second processing unit group $G_2$, a resist coating unit 40 and a developing unit 41 are two-tiered from the bottom in order.

Figure 3:
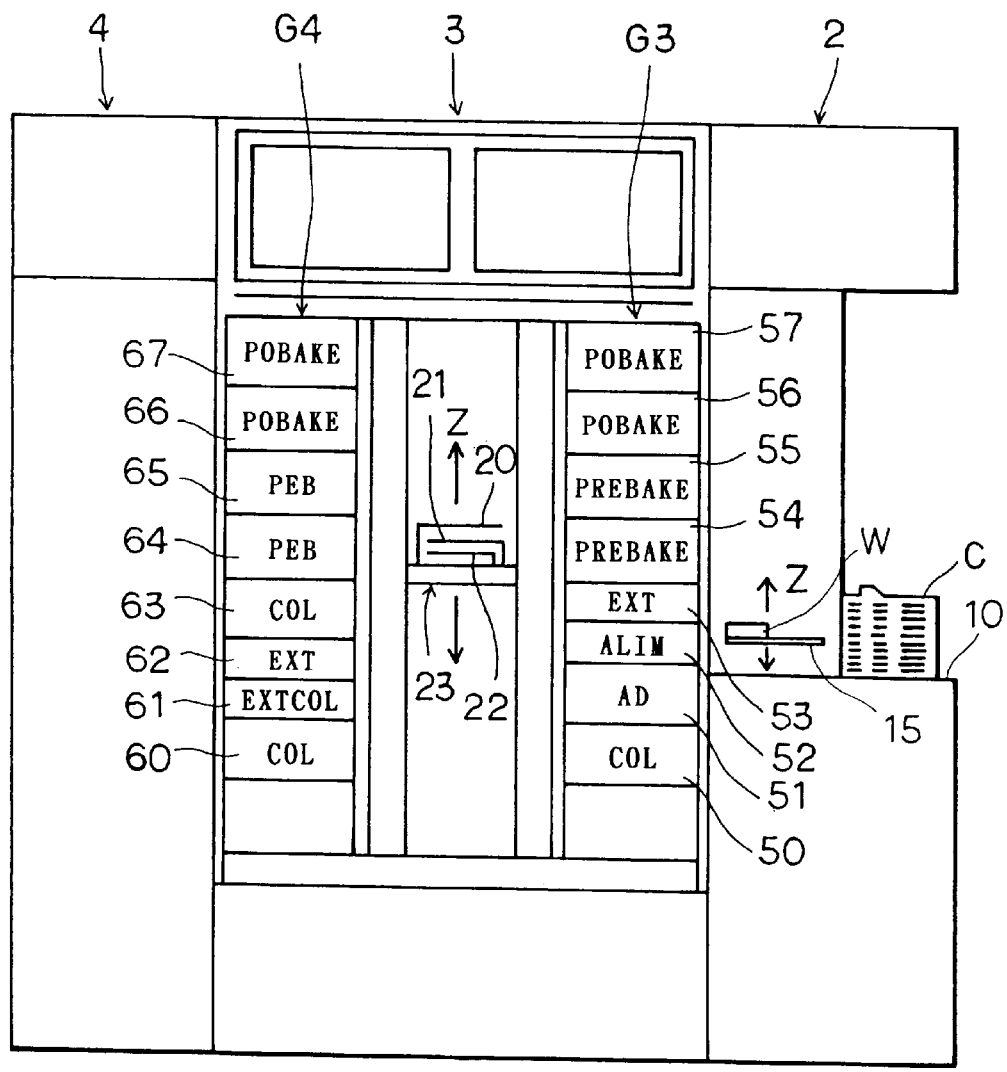
FIG. 3 is a rear view of the coating and developing system in FIG. 1.

As shown in FIG. 3, in the third processing unit group $G_3$, oven-type processing units in each of which the wafer W is placed on a mounting table to undergo predetermined processing, for example, a cooling unit 50 for cooling the wafer W, an adhesion processing unit 51 for performing hydrophobic processing to enhance fixedness of a resist, an alignment unit 52 for aligning the wafer W, an extension unit 53 for keeping the wafer W waiting, prebaking units 54 and 55 for heating the wafer W coated with a resist solution, and postbaking units 56 and 57 for heating the developed wafer W are, for instance, eight-tiered from the bottom in order. In the fourth processing unit group $G_4$, a cooling unit 60, an extension and cooling unit 61 for cooling the wafer W which is kept waiting, an extension unit 62, a cooling unit 63, post-exposure baking units 64 and 65 for heating the exposed wafer W, and postbaking units 66 and 67 are, for instance, eight-tiered from the bottom in order. The combination and stacking order of these processing units can be optionally set.

A wafer transfer body 71 is provided at the center of the interface section 4. Similarly to the wafer transfer body 11, the wafer transfer body 71 is structured to be movable along a transfer path 72 in the X-direction and the Z-direction (the vertical direction) and rotatable in the θ-direction so that it can send and receive the wafer W to/from the extension and cooling unit 61 and the extension unit 62 included in the fourth processing unit group $G_4$, and that it can also send and receive the wafer W to/from a peripheral aligner 73 for removing a resist film at the peripheral portion of the wafer W, which is disposed on the rear side of the interface section 4.

As shown in FIG. 2, the above coating and developing system 1 is usually installed on a grating 74 composing a floor in a clean room, and an air feeder 81 is installed in a space under the floor below the grating 74.

Figure 4:
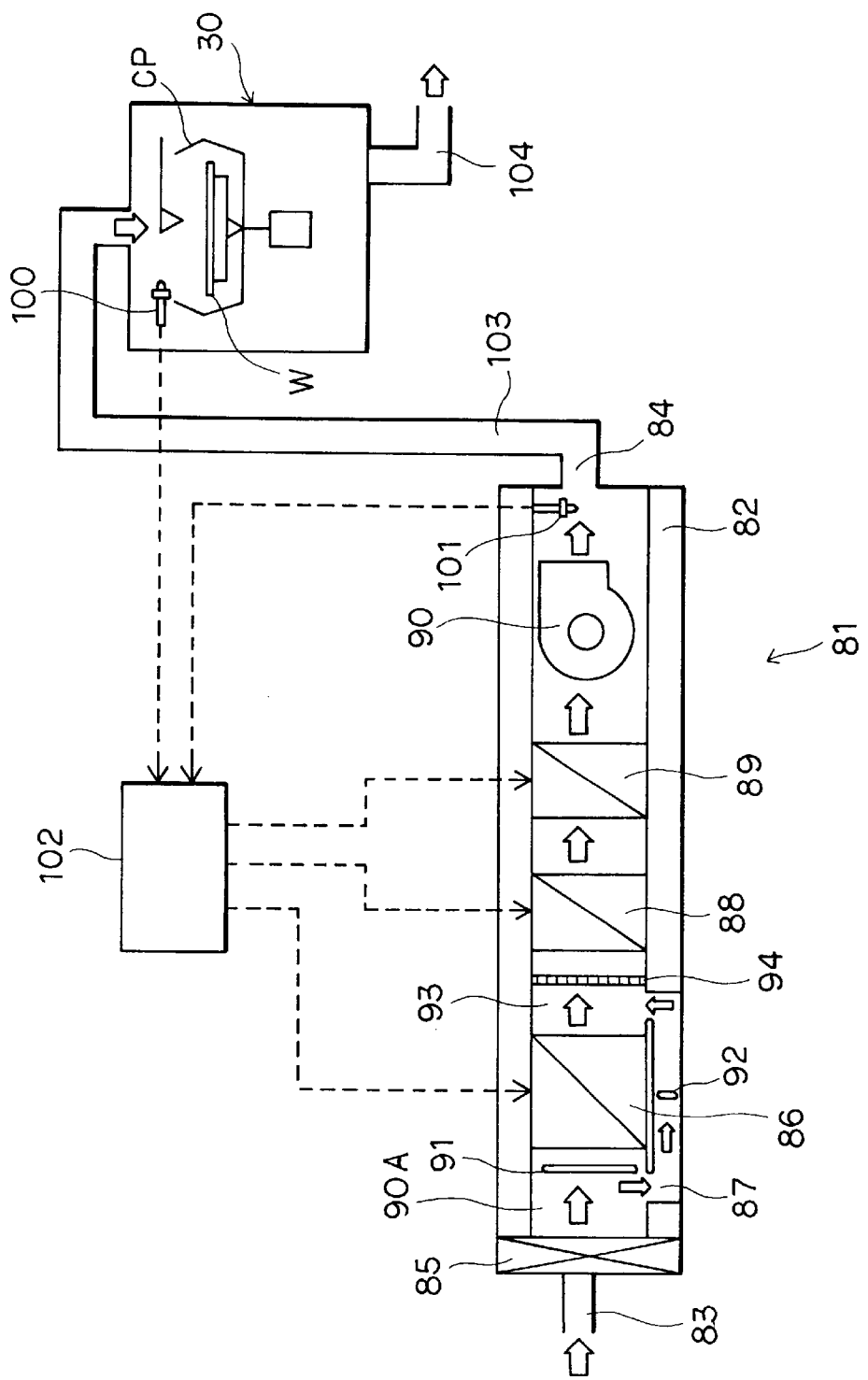
FIG. 4 is an explanatory view schematically showing a section of an air feeder used in the coating and developing system in FIG. 1.
Figure 5:
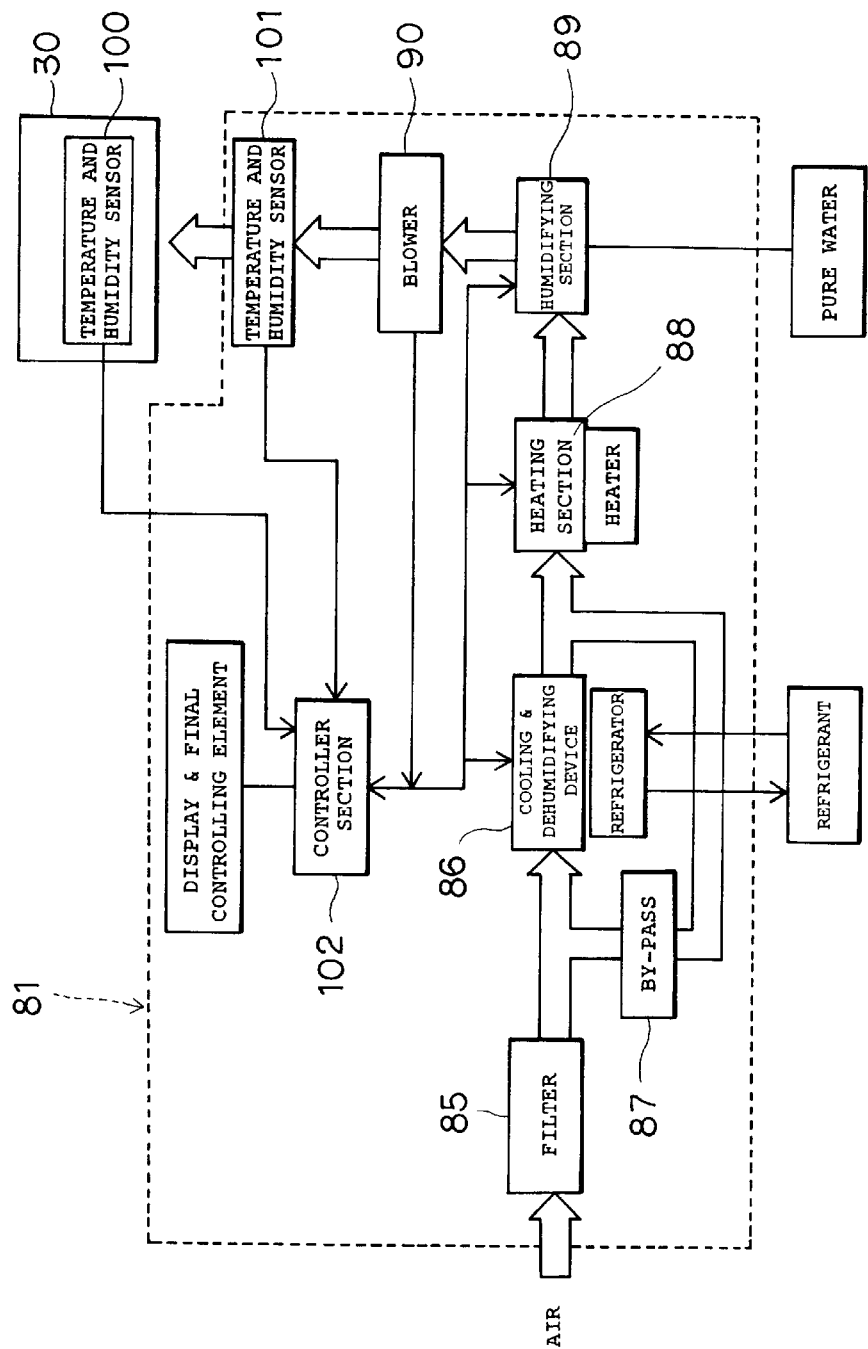
FIG. 5 is an explanatory diagram showing the configuration of the air feeder in FIG. 4.
Figure 6:
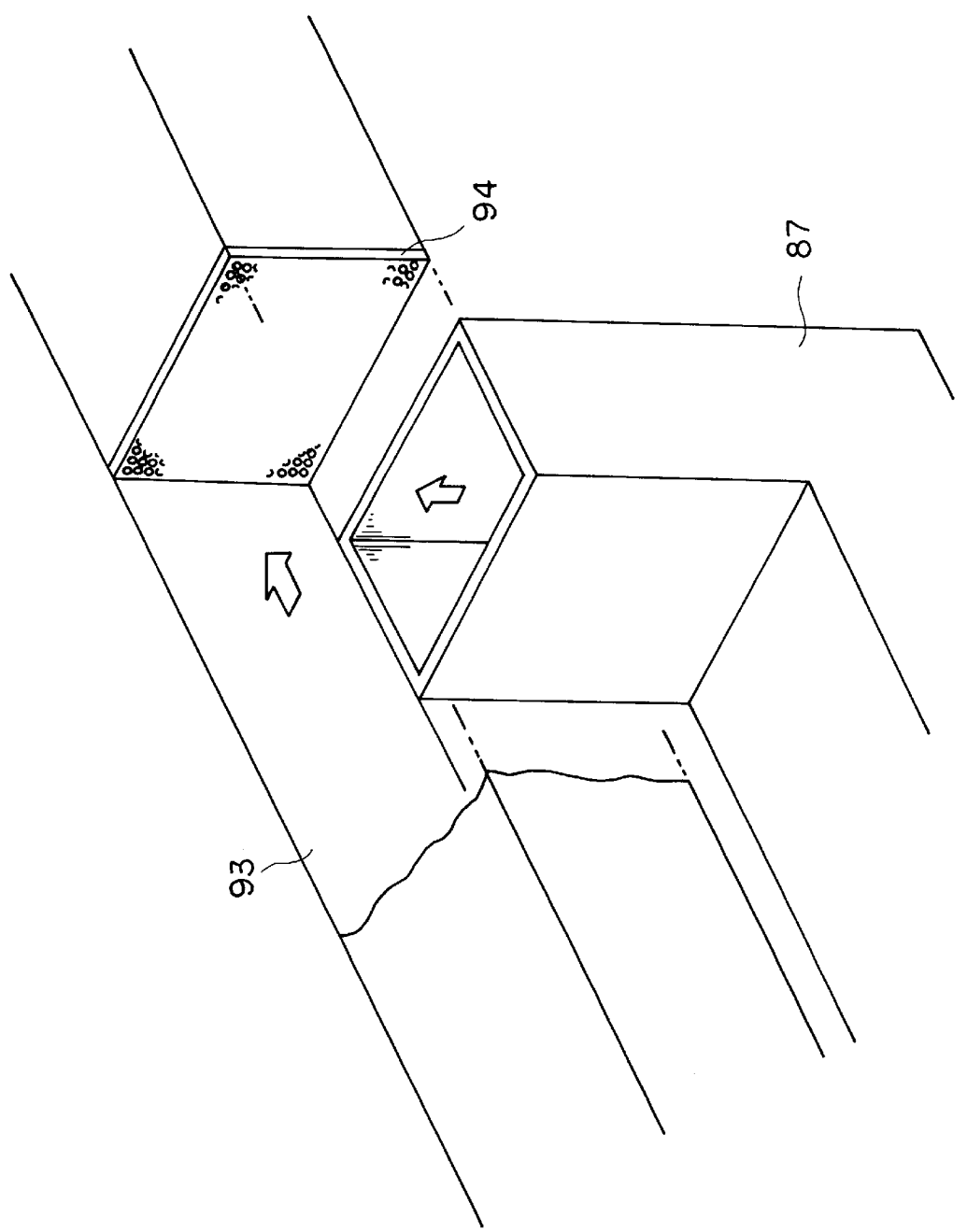
FIG. 6 is a perspective view of a punching metal provided in a passage.

The air feeder 81 has a configuration shown in FIG. 4 to FIG. 6. Namely, in the following order from the side of an inlet 83 as an air inlet to the side of an outlet 84 in a chamber 82, a filter 85 for collecting particles, a cooling section 86 for cooling, for example, 55% of air cleaned by passing through the filter 85, a by-pass 87 for allowing 45% of the air cleaned by passing through the filter 85 to bypass the cooling section 86, a passage 93 as a mixing section for mixing the air cooled in the cooling section 86 and the air from the by-pass 87, a heating section 88 for heating the mixed air mixed in the passage 93, a humidifying section 89 for humidifying the heated air in the heating section 88, and a blower 90 for supplying the humidified air from the outlet 84, for example, to the resist coating unit 30 are provided in the chamber 82.

Incidentally, if the quantity of air bypassed by the by-pass 87 is within nearly 40% to 70% of the quantity of air introduced from the inlet 83 as the air inlet, suitable performance is possible.

The cooling section 86 includes a refrigerator for cooling the air by a refrigerant, for instance. A damper 91 as variable means is provided in a passage 90A on the inlet 83 side in the cooling section 86, and the flow rate of air flowing into the cooling section 86 is controlled by the damper 91. A damper 92 is also provided in the by-pass 87. Further, the cooling section 86 can be precisely controlled, for example, by power control of a power supply.

As shown in FIG. 6, a punching metal 94 in which many small through-holes are bored is provided in the passage 93 on the outlet 84 side in the cooling section 86. The punching metal 94 is disposed in a place (the passage 93 as the mixing section) where the air cooled in the cooling section 86 and the air from the by-pass 87 are mixed.

Figure 7:
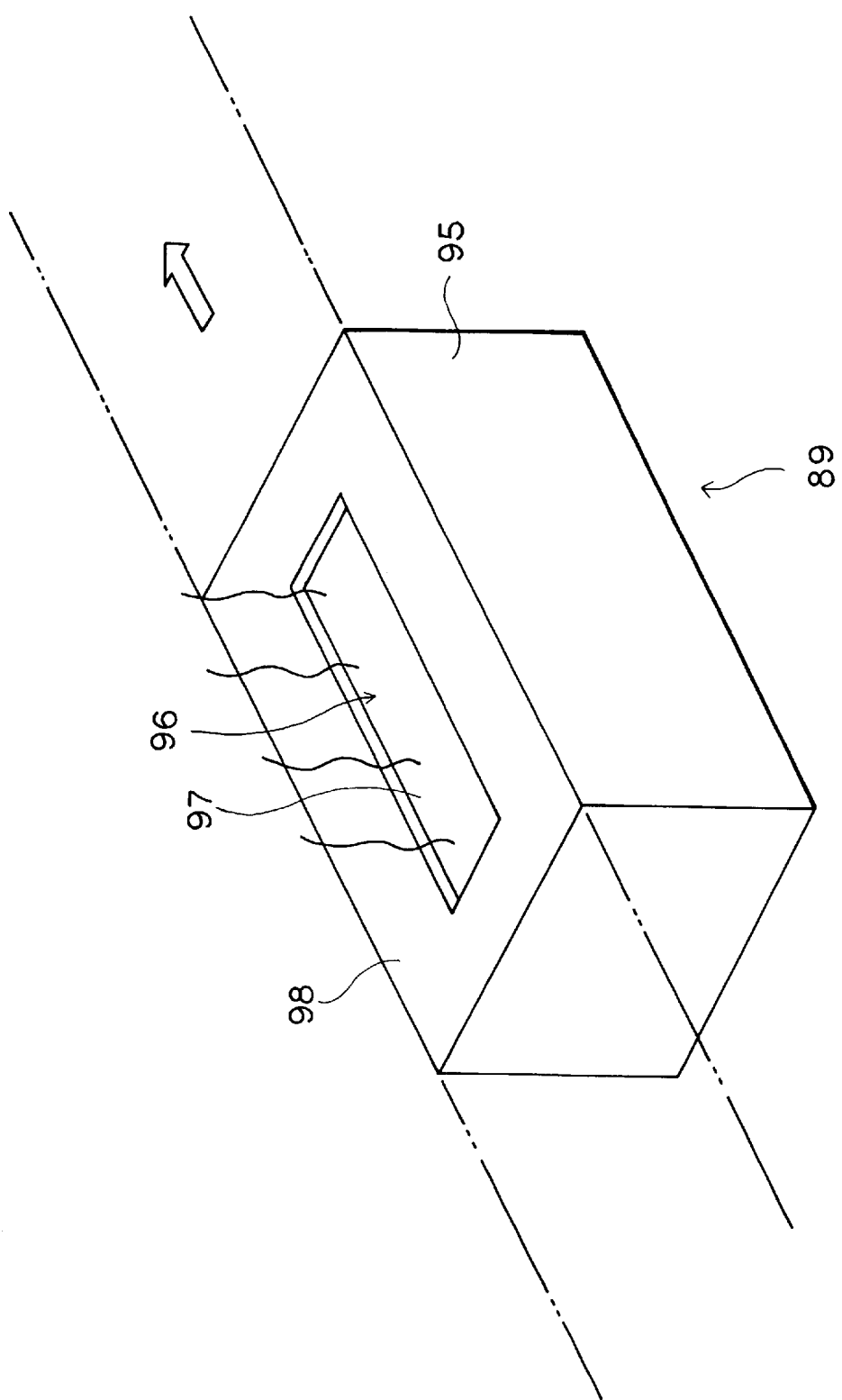
FIG. 7 is a perspective view of a tank provided in a humidifying section.

The heating section 88 includes an electric heater, for example. The humidifying section 89 is composed of vapor jet device of such a system that pure water in a tank 95 is heated and vaporized by the electric heater (not illustrated), for instance, as shown in FIG. 7. A blocking plate 98 in the center of which an opening 97 is formed is provided on a vapor jet surface 96 from which vapor is jetted in the tank 95 of the humidifying section 89, so that the peripheral portion of the vapor jet surface 96 is blocked by the blocking plate 98. Moreover, both the heating section 88 and the humidifying section 89 can be precisely controlled by electrical control such as power control of the power supply.

A temperature and humidity sensor 100 for detecting the temperature and humidity inside the cup CP is provided, for example, in the vicinity of the cup CP in the resist coating unit 30. Further, a temperature and humidity sensor 101 for detecting the temperature and humidity of the air passing through the outlet 84 is provided at the outlet 84 of the air feeder 81. The temperature and humidity detected by these temperature and humidity sensors 100 and 101 are sent to a controller section 102. The controller section 102 is configured to control the cooling section 86, the heating section 88, and the humidifying section 89 in accordance with temperature and humidity signals from the temperature and humidity sensors 100 and 101. The air going out of the outlet 84 is supplied into the cup CP in the resist coating unit 30 through a duct 103, and an atmosphere in the resist coating unit 30 is exhausted, for example, to a factory concentrated exhaust system (not illustrated) through an exhaust duct 104.

The coating and developing system 1 according to the present embodiment is configured as above, and the operation and the like thereof will now be explained. First, in the cassette station 2, the unprocessed wafer W housed in the cassette C on the cassette mounting table 10 is taken out by the wafer transfer body 11 and carried into the alignment unit 52 included in the third processing unit group $G_3$. The wafer W which has completed predetermined alignment is taken out by the main transfer device 23 and carried into the adhesion processing unit 51 to undergo hydrophobic processing, and thereafter transferred to the cooling unit 50 included in the third processing unit group $G_3$ to be cooled to a predetermined temperature. Subsequently, the wafer W is transferred to the resist coating unit 30 included in the first processing unit group $G_1$, where a resist film with a predetermined thickness is formed on the front surface of the wafer W in a spin coating method.

Incidentally, the thickness of the resist film is sensitive to temperature and humidity, so that the temperature and atmosphere inside the cup CP are strictly controlled to be a predetermined temperature and humidity. In the present embodiment, air in the clean room is taken in from the inlet 83 side of the air feeder 81 and supplied into the cup CP in the resist coating unit 30, and the temperature and humidity inside the cup CP are set and maintained, for example, at 23° C. and 45% (RH). The temperature and humidity of the air introduced from the inlet 83 side of the air feeder 81 are usually different from the temperature and humidity inside the cup CP, and hence they are controlled in the air feeder 81.

Specifically, the air introduced from the inlet 83 side of the air feeder 81 is at 23° C. and 45% (RH). As shown in FIG. 4 and FIG. 5, for example, 55% of the above air is cooled bypassing through the cooling section 86. Meanwhile, the remaining 45% of the air is bypassed by the by-pass 87 without passing through the cooling section 86, and maintained in the state in which it was introduced from the inlet 83 side. In this case, nearly half of the air only is cooled in the cooling section 86, thus reducing consumed electric power during cooling as compared with the case where all of the introduced air is cooled.

The cooled air and the air from the by-pass 87 are mixed in the passage 93 as the mixing section. The temperature of the cooled air is, for example, at 5° C. On the other hand, the temperature of the air from the by-pass 87 has not changed since the air was introduced from the inlet 83 side and is maintained at 23° C., for instance. Both of the air flows different in temperature enter the passage 93 and pass through the punching metal 94 to be mixed. At this time, both the air flows different in temperature can be satisfactorily mixed owing to dispersion effect of the punching metal 94.

The mixed air is thereafter heated in the heating section 88, and finally humidified in the humidifying section 89 to a predetermined temperature and humidity. The air which reaches the predetermined temperature and humidity is supplied into the cup CP in the resist coating unit 30 by the blower 90. In this situation, as shown in FIG. 7, vapor is jetted from the vapor jet surface 96 to thereby add moisture necessary for the air in the humidifying section 89. In this case, since the blocking plate 98 having the opening 97 in the center thereof is provided on the vapor jet surface 96, the vapor jetting area is limited in comparison with the case where vapor is jetted from the whole vapor jet surface 96, whereby the flow velocity (jet velocity) of vapor jetted from the vapor jet surface 96 can be improved. For example, the jet velocity is 0.1 m/s when vapor is jetted from the whole vapor jet surface 96, whereas the jet velocity can be improved to 0.3 m/s when the blocking plate 98 is provided on the vapor jet surface 96. Further, the influence of disturbance is eliminated, thereby facilitating generation of vapor.

In the aforesaid air feeder 81, the temperature and relative humidity of the mixed air are higher as compared with the case all of the introduced air is cooled, whereby consumed electric power during heating and humidification as well as during cooling in the cooling section 86 can be reduced, thus making energy-saving temperature and humidity control possible. Moreover, designs and the like of the cooling section 86, the heating section 88, and the humidifying section 89 can be one size smaller than in the prior art owing to the energy saving. Consequently, it becomes possible to downsize the feeder.

Figure 8:
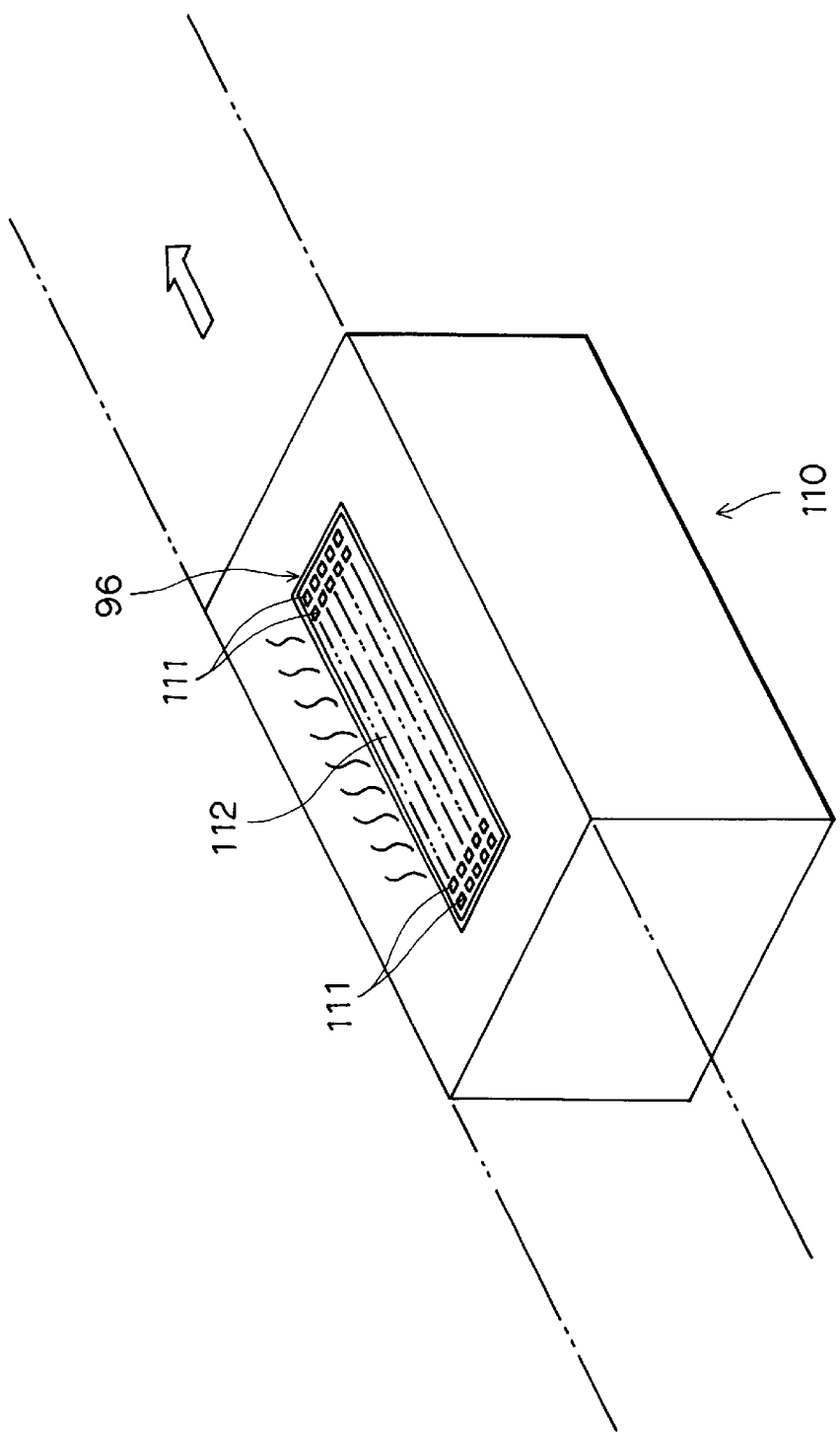
FIG. 8 is a perspective view of another tank in which a diffusing plate is provided on a vapor jet surface.

Further, as with the humidifying section 110 shown in FIG. 8, a diffusing plate 112 having numerous vent through-holes 111 may be attached at the opening 97 in the vapor jet surface 96. According to the above configuration, vapor is diffused around by the diffusing plate 112, whereby the air can be thoroughly humidified.

The above is the explanation of the air feeder 81 for supplying air which is controlled at the predetermined temperature and humidity into the cup CP in the resist coating unit 30. The coating and developing system 1 according to the present embodiment, however, may include an air feeder for supplying air which is controlled at a predetermined temperature and humidity to the outer peripheries of the resist coating unit 30 and various processing units. An air feeder 120 shown in FIG. 9 is an example of the above air feeder.

Figure 9:
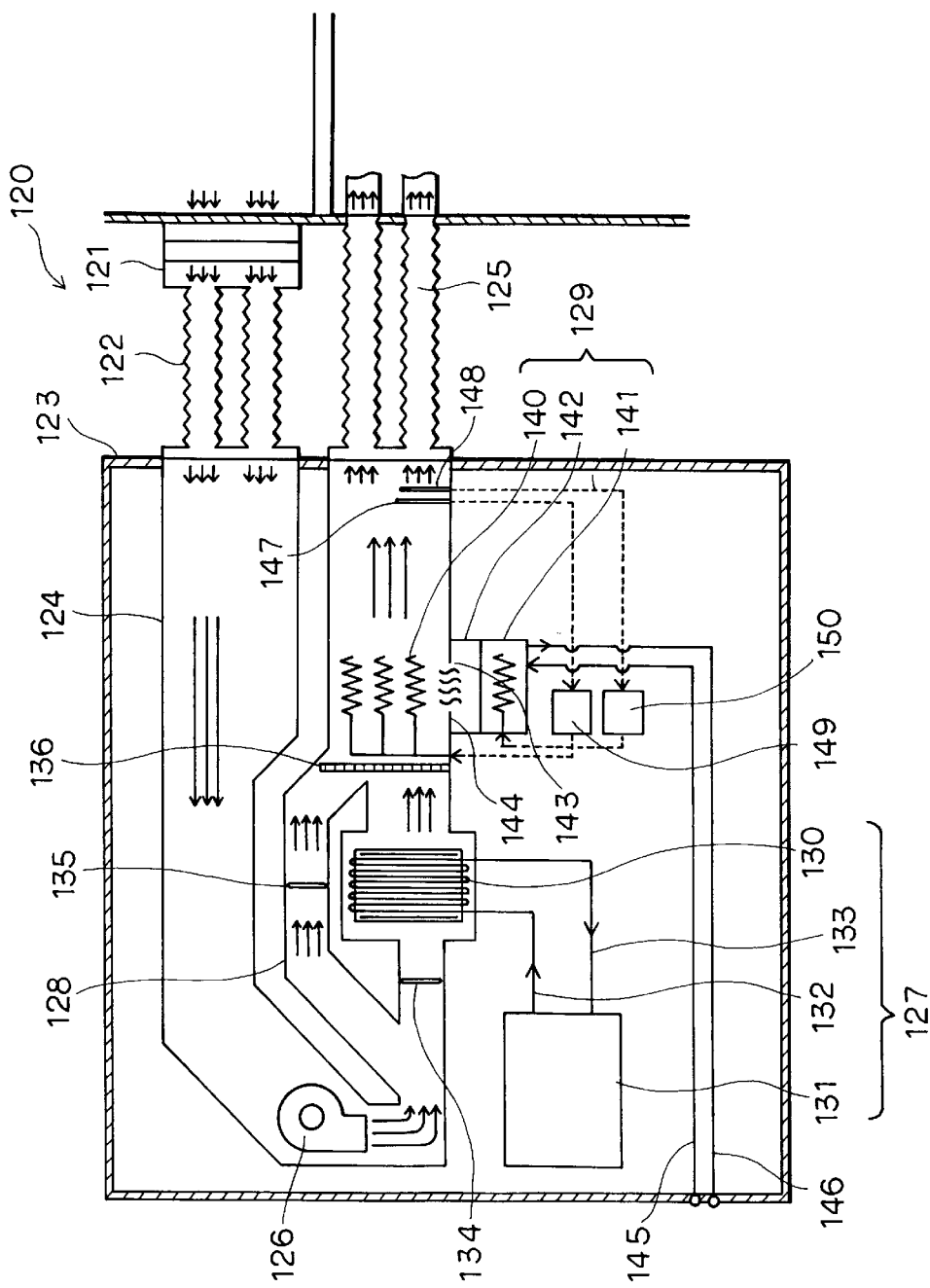
FIG. 9 is an explanatory view schematically showing a section of another air feeder used in the coating and developing system in FIG. 1.

As shown in FIG. 9, the air feeder 120 is installed across a wall from a work area where the coating and developing system 1 is placed. The air feeder 120 introduces air cleaned by a filter 121 from an inlet 122 side into a casing 123 and guides it to an outlet 125 side through a duct 124. A blower 126, a cooling section 127 and a by-pass 128, and a heating and humidifying section 129 are provided in order from the inlet 122 side to the outlet 125 side in the duct 124.

The cooling section 127 has a cooling coil 130 through which a refrigerant circulates, and the refrigerant introduced from a refrigerant supply source 131 through a refrigerant introduction pipe 132 circulates in the cooling coil 130 and is returned again to the refrigerant supply source 131 from a refrigerant discharge pipe 133. The flow rate of air in the cooling section 127 is regulated by a damper 134 provided for the cooling section 127, and the flow rate of air in a by-pass 128 is regulated by a damper 135 provided in the by-pass 128. A punching metal 136 is provided on this side of the heating and humidifying section 129.

The heating and humidifying section 129 has an electric heater 140 and a tank 142 for heating and vaporizing stored pure water by an electric heater 141. Similarly to the tank 95 in the air feeder 81, the tank 142 is also provided with a blocking plate 144 on a vapor jet surface 143. The pure water in the tank 142 is supplied through a pure water supply channel 145 and drained through a pure water drainage channel 146. A temperature sensor 147 and a humidity sensor 148 are provided on the outlet 125 side. A temperature signal from the temperature sensor 147 is sent to a controller section 149 and a humidity signal from the humidity sensor 148 is sent to a controller section 150. The electric heater 140 is controlled by the controller section 149, and the electric heater 141 is controlled by the controller section 150.

According to the air feeder 120 configured as above, both heating and humidification are performed for mixed air of cooled air and air from the by-pass 128 in one place in the heating and humidifying section 129, thereby saving installation space for the feeder. Naturally, as with the aforesaid air feeder 81, energy-saving temperature and humidity control is possible. It is possible that air introduced at 23° C. and 40% (RH), for example, is controlled to a predetermined temperature and humidity and supplied to the coating and developing system 1 to thereby form the downflow of air at 23° C. and 45% (RH), for example, on the outer periphery of the resist coating unit 30.

Next, another embodiment of the present invention will be described with reference to FIG. 10.

Figure 10:
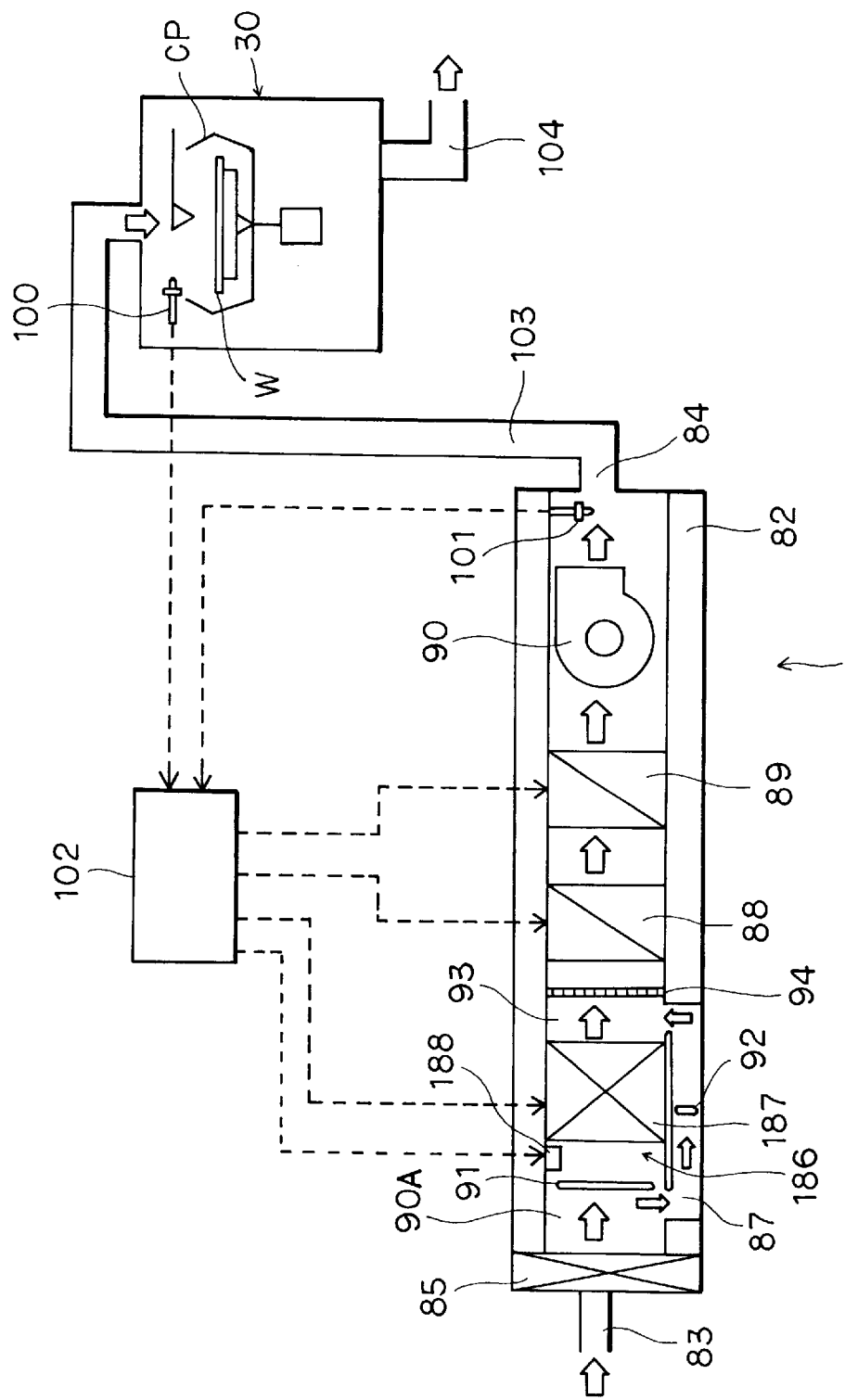
FIG. 10 is an explanatory view schematically showing a section of an air feeder according to another embodiment of the present invention.

In an air feeder 181 shown in FIG. 10, a cooling section 186 has a refrigerator 187 and a Peltier element 188. The controller section 102 controls the refrigerator 187 and the Peltier element 188 in accordance with detection results by the temperature and humidity sensors 100 and 101. In this embodiment, the Peltier element 188 is disposed in the cooling section 186 and adaptively controlled, thereby enabling the control of temperature and humidity with higher precision. It should be mentioned that the same numerals and symbols are given to the same components as those shown in FIG. 4.

Figure 11:
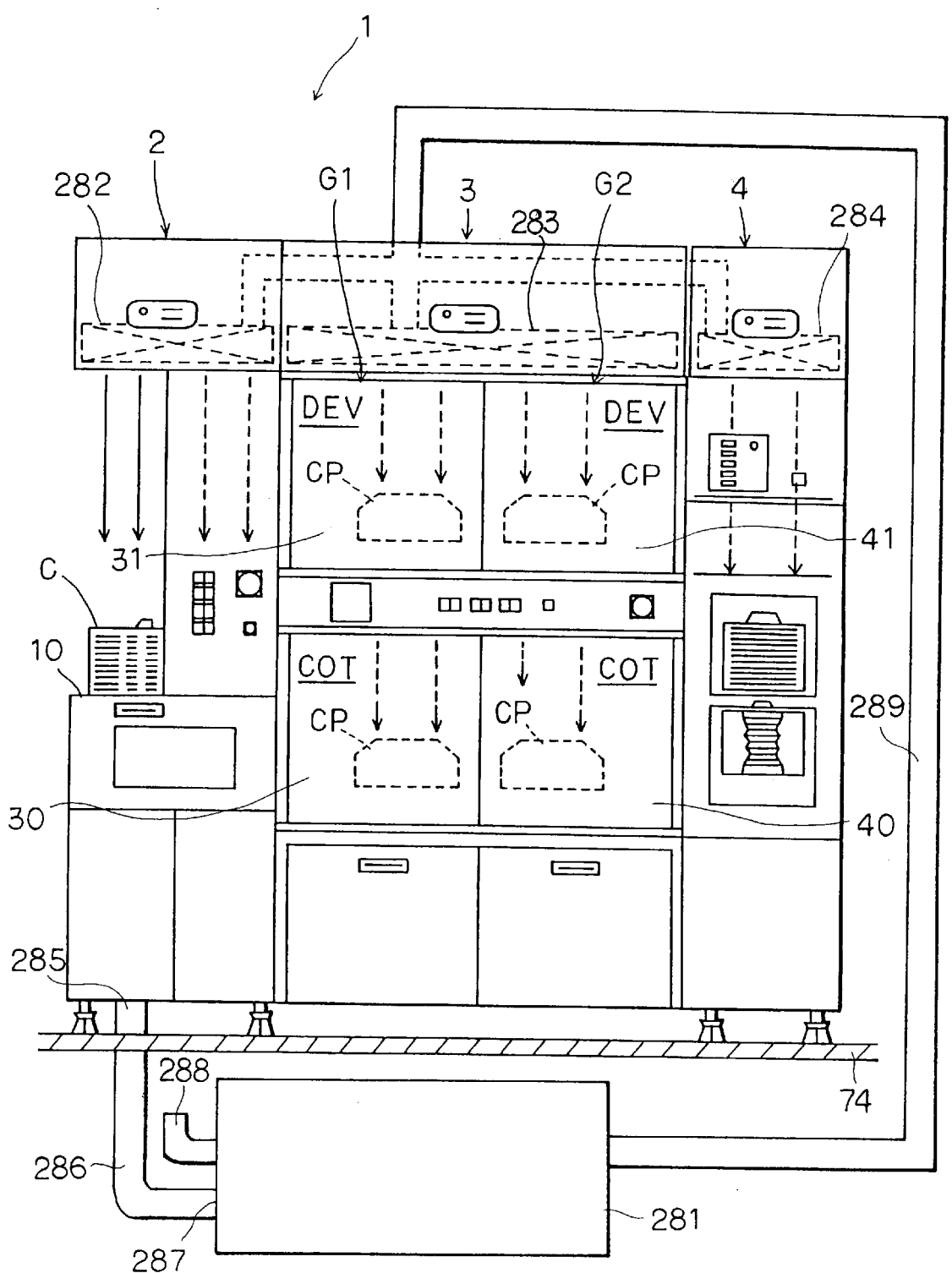
FIG. 11 is a front view of a coating and developing system according to still another embodiment of the present invention.

Next, still another embodiment of the present invention is shown in FIG. 11.

An air feeder 281 shown in FIG. 11 supplies air to air feed sections 282, 283, and 284, which are disposed respectively on top of the cassette station 2, the processing station 3, and the interface section 5 in the coating and developing system 1, via piping 289. Down-flowing clean air of which the temperature and humidity are controlled is supplied from the air feed sections 282, 283, and 284 to respective sections. Provided at the bottom of the coating and developing system 1 is an exhaust port 285 for collecting the above air exhausted from the system. The air exhausted from the exhaust port 285 is collected into the air feeder 281 via piping 286.

In the coating and developing system 1 according to this embodiment, nearly 30% of the air supplied to the respective sections from the air feed sections 282, 283, and 284 leaks to the outside without being collected into the air feeder 281 via the exhaust port 285. Therefore, the air feeder 281 has an outside air inlet 288 for introducing air from the outside in addition to a collected air inlet 287 as an air inlet connected to the piping 286. In the air feeder 281, the nearly 30% deficiency of air is introduced from the outside through the outside air inlet 288.

Incidentally, nearly 30% of the air supplied to the respective sections from the air feeder sections 282, 283, and 284 leaks to the outside from the coating and developing system 1 as described above, the quantity of air supplied from the air feeder 281 to the coating and developing system 1 needs to be large. Accordingly, it is preferable to dispose the blower 126 at a stage before the cooling section 130 and the by-pass 128 as shown in FIG. 9. When the blower 90 is disposed at a stage after the humidifying section 89 as shown in FIG. 4, the cooling section 86, the heating section 88, the humidifying section 89, and the like respectively suck in air from the former stage side, and hence air is drawn in from around. As a result, the air supply becomes large in quantity, thereby not controlling temperature and humidity precisely, and moreover causing particles to be drawn in. Contrary to this, when the blower 126 is disposed at the stage before the cooling section 130 and the by-pass 128 as shown in FIG. 9, air is emitted to the outside on the former stage side of the cooling section, the heating section, the humidifying section, and the like, thereby controlling temperature and humidity precisely and not causing particles to be drawn in.

Next, yet another embodiment of the present invention will be described with reference to in FIG. 12.

Figure 12:
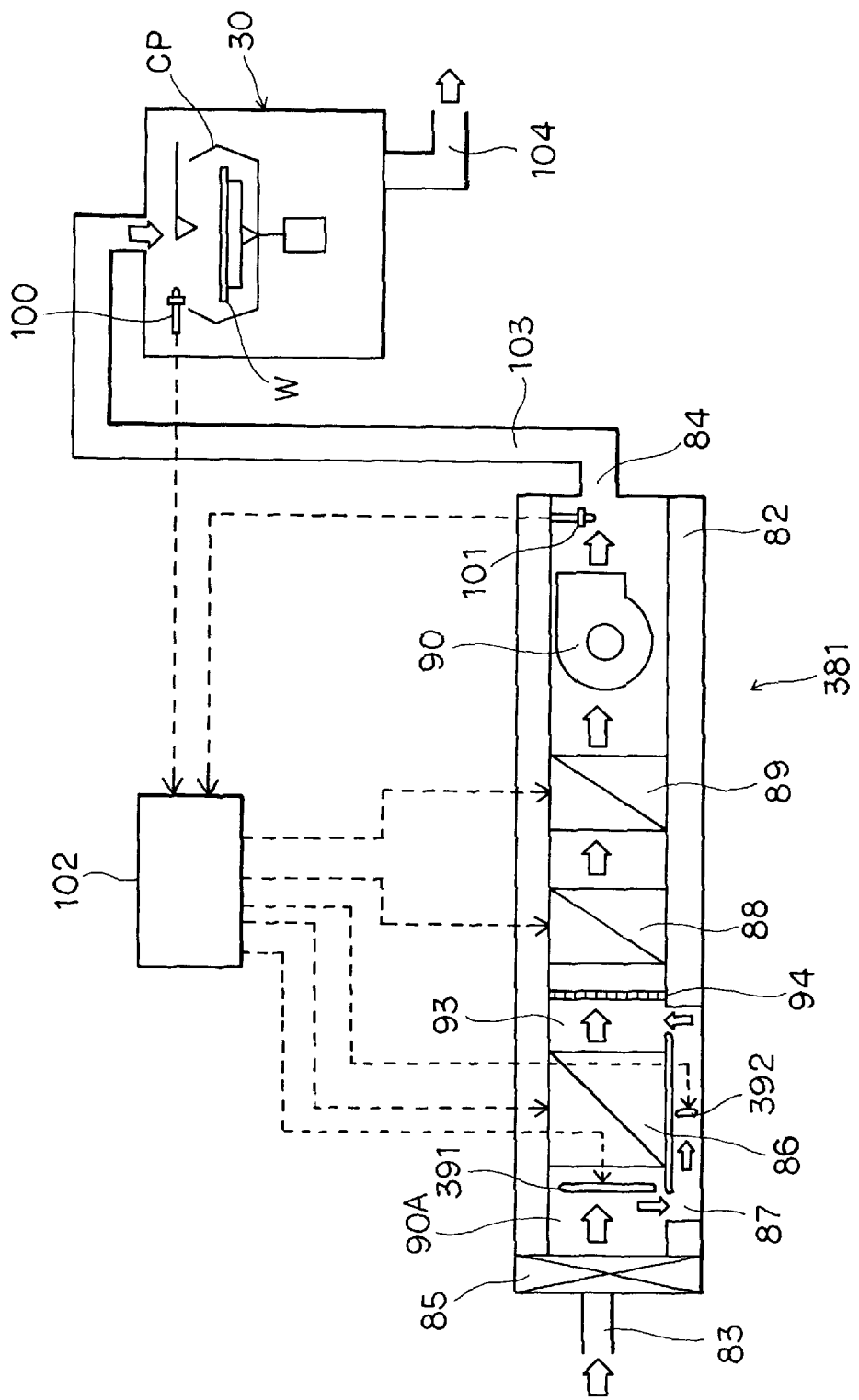
FIG. 12 is an explanatory view schematically showing a section of an air feeder according to yet another embodiment of the present invention.

In an air feeder 381 shown in FIG. 12, the controller section 102 can control the ratio of the quantity of air passing through the cooling section 86 to the quantity of air passing through the by-pass 87 by controlling dampers 391 and 392. The controller section 102 controls the above ratio in accordance with detection results by the temperature and humidity sensors 100 and 101. In this embodiment, especially such control that energy by the cooling section 86, the heating section 88, and the humidifying section 89 become minimum can be easily performed by the above control.

The aforesaid embodiments are explained based on the case where air is supplied to the resist coating unit or the like in the coating and developing system, but the present invention is not limited to the above case, and it is naturally applied to the case where air is supplied to other processing units such as the developing unit which involve predetermined temperature and humidity control. Further, although the aforesaid embodiments are explained with the example in which the wafer is used for a substrate, the present invention is not limited to this example, but applicable to an LCD substrate and other substrates, for example.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus comprising a processing container for processing a substrate and an air feeder for controlling temperature and humidity of air introduced from an air inlet and supplying the air to the processing container, wherein the air feeder comprises:
    a cooling section that cools a first portion of the air introduced from the air inlet;
    a by-pass that allows a second portion of the air introduced from the air inlet to bypass the cooling system;
    a mixing section that mixes the first portion of air cooled by the cooling section and the second portion of air bypassed by the by-pass;
    a heating section that heats the air mixed by the mixing section; and
    a humidifying section that humidifies the air heated by the heating section,
    wherein the humidifying section comprises a vapor jet device having a vapor jet surface from which vapor is jetted and a blocking plate that blocks part of the vapor jet surface.

2. The apparatus as set forth in claim 1,
    wherein the air feeder further comprises a blower that blows the air humidified by the humidifying section into the processing container.

3. The apparatus as set forth in claim 1,
    wherein the air feeder further comprises a blower that blows the air introduced from the air inlet into the cooling section and the by-pass.

4. The apparatus as set forth in claim 1,
    wherein the humidifying section further comprises a diffusing plate disposed to cover the vapor jet surface and having a large number of vent through-holes.

5. The apparatus as set forth in claim 1,
    wherein the heating section and the humidifying section are integrated.

6. The apparatus as set forth in claim 1,
    wherein the mixing section further comprises a mixer that accelerates mixing of the air cooled by the cooling section and the air bypassed by the by-pass.

7. The apparatus as set forth in claim 1, further comprising:
    a sensor that detects temperature and humidity of air to be supplied to the processing container; and
    a controller that controls heating of air by the heating section and humidification of air by the humidifying section in accordance with the temperature and humidity of air detected by the sensor.

8. The apparatus as set forth in claim 7,
    wherein the cooling section comprises a Peltier element that cools the air introduced from the air inlet, and
    wherein the controller controls the Peltier element in accordance with the temperature of air detected by the sensor.

9. The apparatus as set forth in claim 1,
    wherein the air feeder further comprises a controller that varies a ratio of the quantity of air introduced from the air inlet and cooled by the cooling section to the quantity of air bypassed by the by-pass.

10. The apparatus as set forth in claim 9, further comprising:
    a sensor that detects temperature and humidity of air to be supplied to the processing container; wherein the controller varies the ratio in accordance with the temperature and humidity of air detected by the sensor and output to the controller.

11. The apparatus as set forth in claim 1,
    wherein the quantity of bypassed air is approximately 40% to 70% of the quantity of air introduced from the air inlet.

12. An air feeder for controlling temperature and humidity of air introduced from an air inlet and supplying the air to a processing container for processing a substrate, comprising:
    a cooling section that cools a first portion of the air introduced from the air inlet;
    a by-pass that allows a second portion of the air introduced from the air inlet to bypass the cooling section;
    a mixing section that mixes the first portion of air cooled by the cooling section and the second portion of air bypassed by the by-pass;
    a heating section that heats the air mixed by the mixing section; and
    a humidifying section that humidifies the air heated by the heating section, said humidifying section comprising a vapor jet device having a vapor jet surface from which vapor is jetted and a blocking plate that blocks part of the vapor jet surface.

13. An air supply method for controlling temperature and humidity of air and supplying the air to a processing container for processing a substrate, comprising the steps of:
    dividing the air to be supplied between a first passage and a second passage;
    cooling the air divided for the first passage;
    mixing the air divided for the first passage and cooled therein and the air divided for the second passage;
    heating the mixed air; and
    humidifying the heated air by jetting vapor from a vapor jet surface having a blocking plate for blocking part of the vapor jet surface.

14. The method as set forth in claim 13, further comprising the step of:
    blowing the humidified air into the processing container.

15. The method as set forth in claim 13, further comprising the step of:
    blowing the air to be supplied before dividing the air to be supplied between the first passage and the second passage.

* * * * *